United States Patent [19]
Schwartz et al.

[11] 3,882,000
[45] May 6, 1975

[54] FORMATION OF COMPOSITE OXIDES ON III-V SEMICONDUCTORS

[75] Inventors: Bertram Schwartz, Westfield; Stuart Marshall Spitzer, Berkeley Heights; Gregory Dyett Weigle, Green Brook, all of N.J.

[73] Assignee: Bell Telephone Laboratories, Incorporated, Murray Hill, N.J.

[22] Filed: May 9, 1974

[21] Appl. No.: 468,423

[52] U.S. Cl. ................ 204/38 A; 29/584; 148/33.3; 204/35 N; 204/42; 204/56 R
[51] Int. Cl. .......................... C23f 17/00; H01l 7/18
[58] Field of Search ........ 204/35 N, 38 A, 38 R, 42, 204/56 R; 29/569; 148/33.3

[56] References Cited

UNITED STATES PATENTS

| | | | |
|---|---|---|---|
| 3,260,626 | 7/1966 | Schink | 117/200 |
| 3,351,825 | 11/1967 | Vidas | 204/29 X |
| 3,457,148 | 7/1969 | Waggener | 204/56 R |
| 3,531,377 | 9/1970 | Croset | 204/14 N |
| 3,547,786 | 12/1970 | Rigo | 204/38 |
| 3,681,147 | 8/1972 | Dhaka et al. | 148/1.5 |
| 3,697,334 | 10/1972 | Yamamoto et al. | 148/33.3 |
| 3,741,880 | 6/1973 | Shiba et al. | 204/15 |
| 3,764,491 | 10/1973 | Schwartz | 204/56 R |
| 3,798,139 | 3/1974 | Schwartz | 204/56 R |

FOREIGN PATENTS OR APPLICATIONS

| | | | |
|---|---|---|---|
| 602,430 | 7/1960 | Canada | 204/38 A |

*Primary Examiner*—John H. Mack
*Assistant Examiner*—Aaron Weisstuch
*Attorney, Agent, or Firm*—L. H. Birnbaum

[57] ABSTRACT

A method of forming a composite oxide on III-V compound semiconductors is disclosed. An oxidizable metal such as Al, Ni, Ta, Ti, Zn or alloys including said metals is deposited on the surface of the semiconductor or on a native oxide grown on the semiconductor. The structure is subjected to an electrolytic oxidation so that all the metal is oxidized and a native oxide is grown into the surface resulting in a composite oxide comprising the native oxide and the metal oxide. This composite oxide can serve to passivate the semiconductor as well as provide a stable mask for etching and diffusion processes. In addition, the composite oxide appears to have a high dielectric strength for use in MOS devices.

12 Claims, 7 Drawing Figures

FORMATION OF COMPOSITE OXIDES ON III-V SEMICONDUCTORS

BACKGROUND OF THE INVENTION

This invention relates to the formation of composite oxides on III-V compound semiconductors, especially gallium containing semiconductors.

The formation of a native oxide by electrolytic means on gallium compound semiconductors has recently been demonstrated. (See U.S. patent application of B. Schwartz, Ser. No. 292,127, filed Sept. 25, 1972, now U.S. Pat. No. 3,798,139.) The oxide has been shown to be an effective barrier to outside contaminants and extremely useful in a variety of methods required for planar processing, e.g., as a mask in diffusion and etching operations. As might be expected, however, the oxide is not completely effective under all of the myriad processing conditions contemplated in device fabrication. For example, oxides as grown on GaP exhibit limited effectiveness as masks in high temperature diffusion operations. In addition, such native oxides are susceptible to etching by various materials such as HCl solutions. Thus, although the as-grown oxide is adequate under most processing conditions, it is desirable to enhance the chemical and thermal stability of the oxide to permit its use in an even greater variety of fabrication techniques. In addition, it would be desirable to enhance the electrical properties of the oxide for use in such applications as MOS devices.

SUMMARY OF THE INVENTION

In accordance with the invention a composite oxide is grown which includes the native oxide and a metal oxide for improved passivation and stability of the oxide. An oxidizable metal such as Al, Ta, Ti, Zn, Ni or alloys including said metals is formed on the surface of the semiconductor or on a native oxide grown on the semiconductor. The structure is then subject to an electrolytic oxidation. It was discovered that this oxidation consumes the metal and the underlying semiconductor to form a composite oxide comprising a native oxide and the metal oxide.

BRIEF DESCRIPTION OF THE DRAWING

These and other features of the invention will be delineated in detail in the description to follow. In the drawing.

DETAILED DESCRIPTION OF THE INVENTION

Figure 1A:
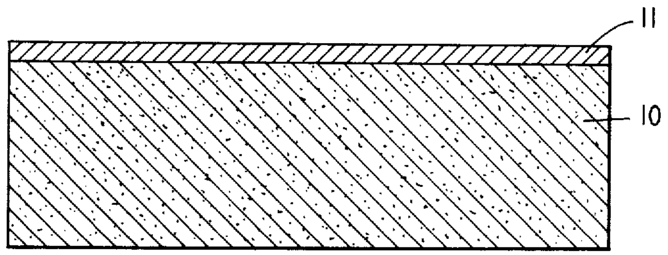
FIGS. 1A–1B are cross-sectional views of a semiconductor sample in two different stages of manufacture in accordance with one embodiment of the invention.
Figure 1B:
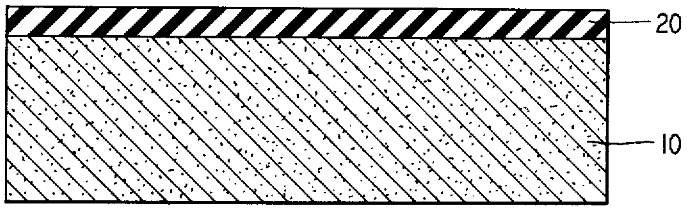

FIGS. 1A-1B illustrate the method in accordance with one embodiment of the invention. The starting material was a sample of n-type GaP, 10, which was Se-doped to a concentration of approximately $5 \times 10^{17}$ atoms $cm^{-3}$. A layer of aluminum, 11, approximately 500 A thick was deposited on the surface of the semiconductor. The particular means employed to form the Al layer was hot filament evaporation, however, several other methods well known in the art may be employed for this purpose. The Al layer should be thin enough so that the entire layer will be consumed during the subsequent oxidation as will be described in more detail below.

Figure 2:
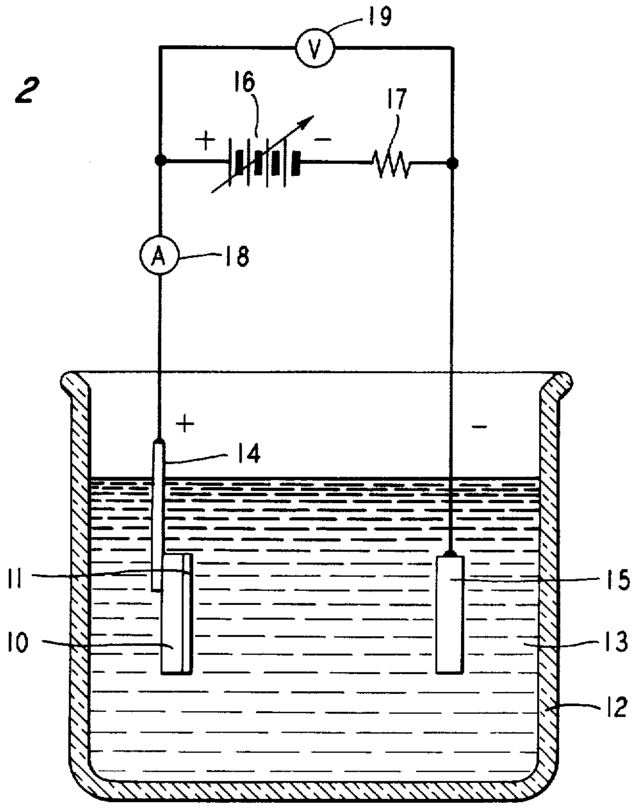
FIG. 2 is a schematic view of an electrolytic oxidation system which may be utilized in accordance with the same embodiment.

The structure was then made the anode in the electrolytic system illustrated schematically in FIG. 2. The liquid electrolyte, 13, was confined within an ordinary container 12. The particular electrolyte employed in this embodiment was water which was adjusted to a pH of approximately 2.5 by the addition of $H_3PO_4$. The semiconductor was attached to an oxidizable metal, 14, in this case Al, and immersed in the electrolyte along with an electrode 15 comprising carbon or one of the noble metals such as gold or platinum, the latter electrode constituting the cathode. Electrically coupled to these samples was an adjustable d.c. voltage source 16 and a current limiting resistor 17 which together represent a constant voltage source. It will be appreciated that a constant current source could be used in the system in place of the constant voltage source. An ammeter 18 and voltmeter 19 were included in the system for monitoring current and voltage, respectively.

A constant voltage of approximately 100 volts was applied across the electrodes and after a few minutes, the power was turned off. It was determined, as illustrated in FIG. 1B, that a native oxide had grown and that the entire layer of Al had been consumed, thereby resulting in a composite native oxide 20, approximately 1200 A thick comprising $Ga_2O_3$, $P_2O_5$ and $Al_2O_3$. The oxide was dried by heating to a temperature of 250° C. for two hours. The same method described above was used to form a composite oxide approximately 2000 A thick comprising $Ga_2O_3$, $As_2O_3$ and $Al_2O_3$ on the surface of an n-type GaAs wafer which was silicon-doped to a concentration of approximately $10^{18}$ atoms $cm^{-3}$.

Tests indicate that this composite oxide should exhibit more stable chemical properties than the undoped oxide formed by the same electrolytic system (see application of B. Schwartz, supra). For example, it was shown that the composite oxide formed on GaP would act as a more effective barrier against Zn dopants during a diffusion operation at 650° C. The composite oxide is also more resistant to etching by an HCl solution, exhibiting an etch rate of approximately 6 A/sec in a 5% HCl solution as compared to 12 A/sec for the undoped oxide. It was also discovered that the composite oxide grown in accordance with the present invention will show enhanced electrical properties in the form of higher resistivity and dielectric breakdown strength.

Apparently, during electrolytic oxidation, the aluminum layer is first oxidized, and once fully oxidized a native oxide is grown into the surface of the underlying semiconductor. It therefore appears necessary if a composite native oxide is desired to completely consume the aluminum layer during oxidation. The maximum metal thickness which will be completely consumed will be dependent upon the potential applied to the system. In particular, it appears that aluminum will be consumed at the rate of approximately 10 A/volt. Thus, for example, a maximum Al thickness for 100 volts of applied bias in accordance with the invention is 1000

A. Since it appears that the maximum applied potential desirable for the elctrolytic systems is 175 volts, an upper limit on the metal thickness is approximately 1750 A. Of course, it is desirable in accordance with the invention to allow sufficient oxidation of the underlying semiconductor. The relative concentration of $Al_2O_3$ and $Ga_2O_3$ in the composite oxide will depend upon particular needs, but can be calculated for any particular metal thickness and applied potential with a knowledge of the rate of consumption of the metal, above, and the rate of consumption of the semiconductor during oxide growth. In the case of GaAs, the latter value has been found to be approximately 20 A/volt and in the case of GaP, approximately 12 A/volt. In most commercial manufactures it appears preferable to form a metal thickness of no more than 1000 A in order to produce a uniform oxide with adequate ratio of $Ga_2O_3$ and $Al_2O_3$, and to consume a minumum of 200 A of semiconductor. A practical minumum thickness of metal is approximately 50 A to insure uniform coverage of the semiconductor surface.

It will be realized that other metals may be used in accordance with the invention. The method described above to form a composite oxide including Al on GaP was repeated with the substitution, in separate embodiments, of 500 A layers of Ti, Ta, Ni and Zn for the Al layer. In all cases, an oxide was formed which included the native oxide and the metal oxide as in the previous embodiments. These metals were also consumed at the rate of approximately 10 A/volt and so the same general thickness requirements are applicable to these metals. The presence of Zn in the oxide appears to impart particular stability to the oxide. For example, the oxide as grown on GaP will tend to crystallize at approximately 650° C. after about 15 minutes. However, the composite oxide including Zn fabricated in accordance with the above method will not crystallize at this temperature for a period of days. Thus, oxides including Zn therein would appear to present particular promise for use as diffusion masks at high temperatures.

It should be appreciated that the present method is not limited to the particular electrolytic system previously described. For example, in a further embodiment, the electrolyte of the system was $H_2O$ with a pH adjusted to approximately 10 by the addition of $NH_4OH$. When a GaP sample with a layer of Zn formed on the surface was treated in this system, a native oxide was grown incorporating the Zn as in the above-described embodiments. It is therefore to be expected that any electrolytic oxidation system which is capable of forming a native oxide on the surface of a III–V compound semiconductor should also form a composite oxide in accordance with the invention. Useful electrolytes for this process thus include an aqueous $H_2O_2$ solution with or without a pH modifier, $H_2O$ with a pH modifier which adjusts the pH to the range 1–5 or 9–13 (see application of Schwartz, supra) and $H_2O$ with a pH of 5–9 which includes a material for supplying ions to add conductivity to the solution such as an ammonium acid phosphate (see U.S. patent application of F. Ermanis and B. Schwartz, Ser. No. 440,657, filed Feb. 8, 1974).

A useful range of applied potential in the electrolytic system appears to be 5-175 volts. The inventive method should be applicable to all III-V compound semiconductors which form a native oxide by electrolytic systems. Particularly useful semiconductors are those containing an appreciable amount of gallium, which include GaAsP, GaAlAs, GaAlP, InGaAs, InGaP and mixtures thereof, in addition to GaAs and GaP previously described. If it is desired to dry the oxide, a preferred cycle appears to be temperatures of 150°-350° C. for ½ hour to 48 hours in a nonoxidizing ambient, such as nitrogen. Although the oxidations described were done at room temperature, the electrolyte may be heated up to its boiling point to increase the speed of oxidation.

Figure 3A:
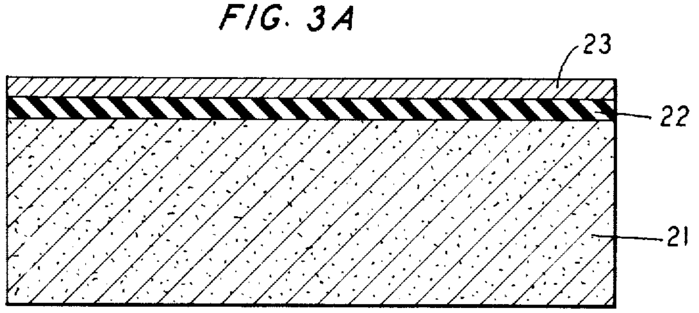
FIGS. 3A-3B are cross-sectional views of a semiconductor sample in two different stages of manufacture in accordance with a further embodiment of the invention.
Figure 3B:
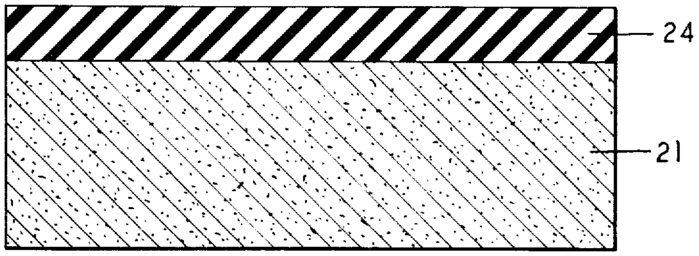

FIGS. 3A-3B show a device in two stages of manufacture in accordance with a further embodiment of the invention. The semiconductor was again a wafer of GaAs, 21. Here, however, approximately 1500 A of native oxide, 22, was grown on the surface of the semiconductor by the electrolytic system wherein the electrolyte was $H_2O$ adjusted to a pH of approximately 2.5 by $H_3PO_4$. A layer, 23, of Al approximately 200 A thick was then deposited on the oxide and the structure placed in the same electrolytic system with a bias of 100 volts applied. It was discovered as illustrated in FIG. 3B that all the aluminum was consumed plus some additional GaAs to form the composite oxide, 24, approximately 2000 A thick.

Thus, it is not necessary that the metal layer be formed directly on the semiconductor surface, but can be deposited on an existing native oxide layer provided the oxide layer is not too thick to prevent further formation of the native oxide during subsequent electrolytic oxidation. Such thickness can be calculated according to known techniques and will not be discussed here.

Figure 4A:
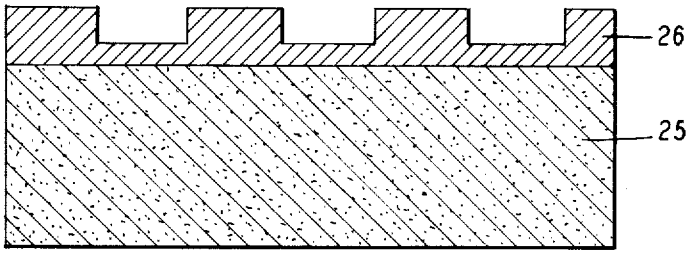
FIGS. 4A-4B are cross-sectional views of a semiconductor sample in two different stages of manufacture in accordance with a still further embodiment of the invention.
Figure 4B:
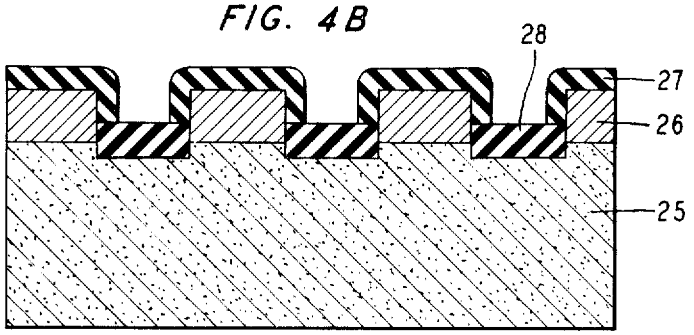

FIGS. 4A–4B illustrate yet another embodiment of the present invention. As shown in FIG. 4A, the starting semiconductor material is again a wafer, 25, of n-type GaAs. In this embodiment, however, the layer of metal, 26, in this case Zn, is formed in a thick-thin pattern as shown in accordance with known techniques. The thin portion is approximately 500 A so that this portion would be entirely consumed in the subsequent oxidation. The thick portion is greater than 2000 A so that only a part of the metal thickness would be consumed. Thus, when the structure is oxidized electrolytically, the configuration illustrated in FIG. 4B results. The composite oxide, 28, as previously described, is formed over the area of semiconductor covered by the thin portions, and a layer of zinc oxide 27 is formed over the thick portions of the metal, with areas of the metal layer, 26, remaining on the surface. When the structure is then heated at a sufficiently high temperature, e.g., at least 550° C., the unconsumed zinc diffuses into the semiconductor in the selected areas thereunder while the composite oxide on the surface of the semiconductor acts as a mask. Thus, in accordance with this embodiment a selective area diffusion can be performed with a sealed diffusion source, without depositing a dielectric, and where the source of dopants can be used subsequently as contact metallization. Furthermore, the same configuration illustrated in FIG. 4B can be used to form crossunder connections in device applications.

It should be noted that in the figures, the composite oxide has been illustrated as a homogeneous layer. It has not yet been determined whether the oxide is primarily the prior art native oxide with the metal impurity distributed uniformly therein or a multilayer of the native oxide and an oxide of the metal. In the context of the inventive method, however, it is not believed that this fact is significant. In addition, FIG. 4B illustrates oxides 27 and 28 separated by sharp boundaries. In actual practice, this boundary is probably graded.

Various additional modifications will become apparent to those skilled in the art. For example, metals other than those specifically described which are oxidizable in electrolytic systems may be found to form composite oxides in accordance with the basic teachings of the invention. Such variations which rely on the teachings through which the invention has advanced the art are properly considered within the spirit and scope of the invention.

What is claimed is:

1. A method of forming a composite oxide on a structure comprising a III-V compound semiconductor comprising the steps of:

forming on said structure over a major portion of the surface of said semiconductor a layer of a conducting metal of uniform thickness which is oxidizable in an electrolytic system wherein the electrolyte comprises a material selected from the group consisting of $H_2O$ adjusted to a pH in the range 1-5 or 9-13, $H_2O$ in a pH range of 5-9 including a material for supplying ions to add conductivity, and an $H_2O_2$ solution;

making the structure the anode in said electrolyte system; and passing a direct current through said system of sufficient magnitude such as to oxidize the entire thickness of said conductor and a portion of the underlying semiconductor over all of the area of said semiconductor surface covered by said conductor to form said composite oxide.

2. The method according to claim 1 wherein the conductor comprises a metal selected from the group consisting of Al, Ta, Ti, Ni and Zn or alloys including such metals.

3. The method according to claim 1 wherein the thickness of the conductor is less than 1750 A.

4. The method according to claim 1 wherein the thickness of the conductor is within the range 50–1000 A.

5. The method according to claim 1 wherein the semiconductor is selected from the group consisting of GaP, GaAs, GaAlAs, GaAlP, GaAsP, InGaAs and InGaP.

6. The method according to claim 1 wherein said conductor layer is formed on a native oxide layer covering said major surface of the semiconductor.

7. A method of forming a composite oxide on a structure comprising a III-V compound semiconductor comprising the steps of:

forming on said structure over a major portion of the surface of said semiconductor a layer of conductor comprising a metal selected from the group consisting of Al, Ta, Ni, Ti and Zn or alloys including such metals, to a uniform thickness in the range 50–1000 A;

making the structure the anode in an electrolytic system wherein the electrolyte comprises a material selected from the group consisting of $H_2O$ adjusted to a pH in the range 1–5 or 9–13, $H_2O$ in the pH range 5–9 including a material for supplying ions to add conductivity, and an $H_2O_2$ solution; and passing a direct current through said system of sufficient magnitude such as to oxidize the entire thickness of said conductor and a portion of the underlying semiconductor over all the area of said semiconductor surface covered by said conductor layer to form said composite oxide.

8. The method according to claim 7 wherein the semiconductor is selected from the group consisting of GaP, GaAs, GaAlAs, GaAlP, GaAsP, InGaAs, and InGaP.

9. The method according to claim 7 wherein said conductor layer is formed on a native oxide layer covering said major surface of the semiconductor.

10. A method of forming a composite oxide on a structure comprising a semiconductor selected from the group consisting of GaP and GaAs comprising the steps of:

forming on said structure over a major portion of the surface of said semiconductor a layer of a metal selected from the group consisting of Al, Ta, Ni, Ti and Zn or alloys including such metals to a thickness in the range 50–1000 A;

making the structure the anode in an electrolytic system wherein the electrolyte comprises a material selected from the group consisting of $H_2O$ adjusted to a pH in the range 1–5 or 9-13, $H_2O$ in a pH range of 5–9 including a material for supplying ions to add conductivity, and an $H_2O_2$ solution; and passing a direct current through said system of sufficient magnitude such as to oxidize the entire thickness of said metal and a portion of the underlying semiconductor over all the area of said semiconductor covered by said metal to form said composite oxide.

11. A method of forming a composite oxide on a structure comprising a III-V compound semiconductor comprising the steps of:

forming on said structure over a major portion of the surface of said semiconductor a layer comprising Zn to a non-uniform thickness so that said layer includes relatively thick portions and thin portions;

making the structure the anode in an electrolytic system wherein the elctrolyte comprises a material selected from the group consisting of $H_2O$ adjusted to a pH in the range 1–5 or 9–13, $H_2O$ in the pH range 5–9 including a material for supplying ions to add conductivity, and an $H_2O_2$ solution; and passing a direct current through said system of sufficient magnitude such as to oxidize the entire thickness of said Zn layer only in the thin portions of said layer and a portion of the underlying semiconductor over the area of semiconductor covered by said thin portions to form a composite oxide in said area.

12. The method according to claim 11 wherein the thin portions of the Zn layer have a thickness within the range 50–1000 A and the thick portions have a thickness greater than 2000 A.

* * * * *